(12) United States Patent  
Chang

(10) Patent No.: US 8,883,540 B2  
(45) Date of Patent: Nov. 11, 2014

(54) METHOD FOR MANUFACTURING PHOTOVOLTAIC MODULE FORMED ON CORRUGATED-SHEET BUILDING MATERIAL

(71) Applicant: Yaue-Sheng Chang, Taoyuan Hsien (TW)

(72) Inventor: Yaue-Sheng Chang, Taoyuan Hsien (TW)

( * ) Notice: Subject to any disclaimer, the term of this patent is extended or adjusted under 35 U.S.C. 154(b) by 122 days.

(21) Appl. No.: 13/771,927

(22) Filed: Feb. 20, 2013

(65) Prior Publication Data

US 2014/0235010 A1  Aug. 21, 2014

(51) Int. Cl.
*H01L 21/00* (2006.01)
*H01L 31/18* (2006.01)

(52) U.S. Cl.
CPC ..................... *H01L 31/18* (2013.01)
USPC ............... 438/57; 438/64; 438/66; 136/244; 136/251; 136/259; 52/173.3

(58) Field of Classification Search
USPC ............... 438/57, 64, 66; 136/244, 251, 259; 52/173.3
See application file for complete search history.

(56) References Cited

U.S. PATENT DOCUMENTS

| | | | |
|---|---|---|---|
| 5,092,939 A * | 3/1992 | Nath et al. | 136/251 |
| 5,590,495 A * | 1/1997 | Bressler et al. | 52/173.3 |
| 5,830,779 A * | 11/1998 | Bressler et al. | 438/65 |
| 5,968,287 A * | 10/1999 | Nath | 136/251 |
| 6,553,729 B1 * | 4/2003 | Nath et al. | 52/173.3 |
| 8,316,593 B2 * | 11/2012 | Smith et al. | 52/173.3 |
| 2001/0054262 A1 * | 12/2001 | Nath et al. | 52/173.3 |
| 2009/0255194 A1 * | 10/2009 | Memari et al. | 52/173.3 |
| 2009/0308001 A1 * | 12/2009 | Wu et al. | 52/173.3 |
| 2010/0236541 A1 * | 9/2010 | Smith et al. | 126/621 |
| 2011/0056534 A1 * | 3/2011 | Ding et al. | 136/244 |
| 2011/0179726 A1 * | 7/2011 | Pao et al. | 52/173.3 |
| 2012/0285533 A1 * | 11/2012 | Chang | 136/259 |

* cited by examiner

*Primary Examiner* — Alexander Ghyka
(74) *Attorney, Agent, or Firm* — Pro-TECHTOR Int'l Services; Ian Oglesby

(57) ABSTRACT

A method for manufacturing a photovoltaic module formed on a corrugated-sheet building material includes: shaping a base board in a manner that the base board thus shaped takes on a corrugated-sheet shape and therefore not only has thereon alternating grooves and ridges but also a processing surface defined between a said groove and an adjacent said ridge; forming a photovoltaic module on the processing surface of the base board by stacking a bottom adhesive film layer, a photovoltaic layer, a top adhesive film layer, and a condensing film layer on the processing surface in bottom-to-top order; rolling the photovoltaic module and the base board against each other at 130~180° C. to effectuate engagement therebetween; and performing lamination within hermetically sealed space at 140~170° C. and 2~10 kg/cm² for 5~10 minutes. A back plate layer is disposed beneath the bottom adhesive film layer and connected to the base board through another adhesive film layer.

8 Claims, 3 Drawing Sheets

METHOD FOR MANUFACTURING PHOTOVOLTAIC MODULE FORMED ON CORRUGATED-SHEET BUILDING MATERIAL

BACKGROUND OF THE INVENTION

1. Technical Field

The present invention relates to building materials, and more particularly, to a method for manufacturing a photovoltaic module formed on a corrugated-sheet building material.

2. Description of Related Art

Due to the great demand for energy resources, various photovoltaic cells for use in photovoltaic conversion are readily available. Nonetheless, it is only when a manufacturing method which is both practicable and practical is available that it is possible to cut manufacturing costs, achieve popularization, and allow photovoltaic cells to be sold to average consumers at affordable prices to the advantage of environmental protection. Conventional photovoltaic cells are usually manufactured and marketed in the form of a module of specific dimensions in order to be installed on the top of a building. If the conventional photovoltaic cells are to be installed on the top of a building, their installation will be regarded as an external mode; and it is necessary that, after the construction of the top of the building has been completed, the conventional photovoltaic cells are designed in a manner that modules each having the photovoltaic cells can be installed on the top of the building one by one. As a result, the conventional photovoltaic cells have drawbacks as follows: each module has an outer frame, thereby adding to its weight; the outer frame has to be fixed in place and jointed, thereby adding to the cost as a result of increased manpower and inconvenience in uninstallation and installation performed for the sake of maintenance; and narrow application. The aforesaid drawbacks of the prior art persist to the detriment of consumer loyalty. Accordingly, it is imperative to overcome the aforesaid drawbacks of the prior art by providing products which meet consumer needs better.

BRIEF SUMMARY OF THE INVENTION

It is an objective of the present invention to provide a method for manufacturing a photovoltaic module formed on a corrugated-sheet building material. The method is advantageously characterized in that the photovoltaic module is directly formed on a building material to thereby save outer frame costs and assembly costs, can be manufactured by mass production in advance, and is directly manufactured in its entirety, to thereby cut costs, increase usable area, enable users to maximize their rewards at the lowest costs, render installation easier and less laborious, render replacement more convenient, render maintenance quick and simple, such that the photovoltaic module can be directly manufactured in the most convenient and quickest manner in accordance with the required dimensions thereof in advance at a factory to meet consumer needs.

In order to achieve the above and other objectives, the present invention provides a method for manufacturing a photovoltaic module formed on a corrugated-sheet building material. The method comprises the steps of: (step 1) shaping a board to function as a base board in a manner that the board thus shaped takes on a corrugated-sheet shape and therefore not only has thereon alternating grooves and ridges but also a processing surface defined between a said groove and an adjacent said ridge; (step 2) forming a photovoltaic module on the processing surface of the base board by stacking, including putting a bottom adhesive film layer on the processing surface of the base board, putting a photovoltaic layer on the bottom adhesive film layer, putting a top adhesive film layer on the photovoltaic layer, and finally putting a condensing film layer on the top adhesive film layer; (step 3) rolling the photovoltaic module and the base board against each other at 130~180° C. to effectuate engagement therebetween; and (step 4) performing lamination on the photovoltaic module and the base board within a hermetically sealed space at 140~170° C. and 2~10 kg/cm2 for 5~10 minutes. The base board is made of metal, such as steel, iron, aluminum, and/or copper, and/or is made of plastic, glass, and/or ceramic, and/or comes in form of a sugarcane board, a fiberboard, a paperboard, and/or a wooden board. A back plate layer is disposed beneath the bottom adhesive film layer of the photovoltaic module. The back plate layer is connected to the base board through another adhesive film layer. The adhesive film layers comprise EVA film or PVB film. The back plate layer is made of insulating engineering plastic. A thermal insulation layer made of PU foam or gypsum is disposed beneath the base board. The photovoltaic layer is silicon based or thin-film.

BRIEF DESCRIPTION OF THE SEVERAL VIEWS OF THE DRAWINGS

To enable persons skilled in the art to gain insight into the technical solution and means of achieving the goals of the present invention, objectives, features, and advantages of the present invention are hereunder illustrated with a preferred embodiment in conjunction with the accompanying drawings, in which.

DETAILED DESCRIPTION OF THE INVENTION

Figure 1:
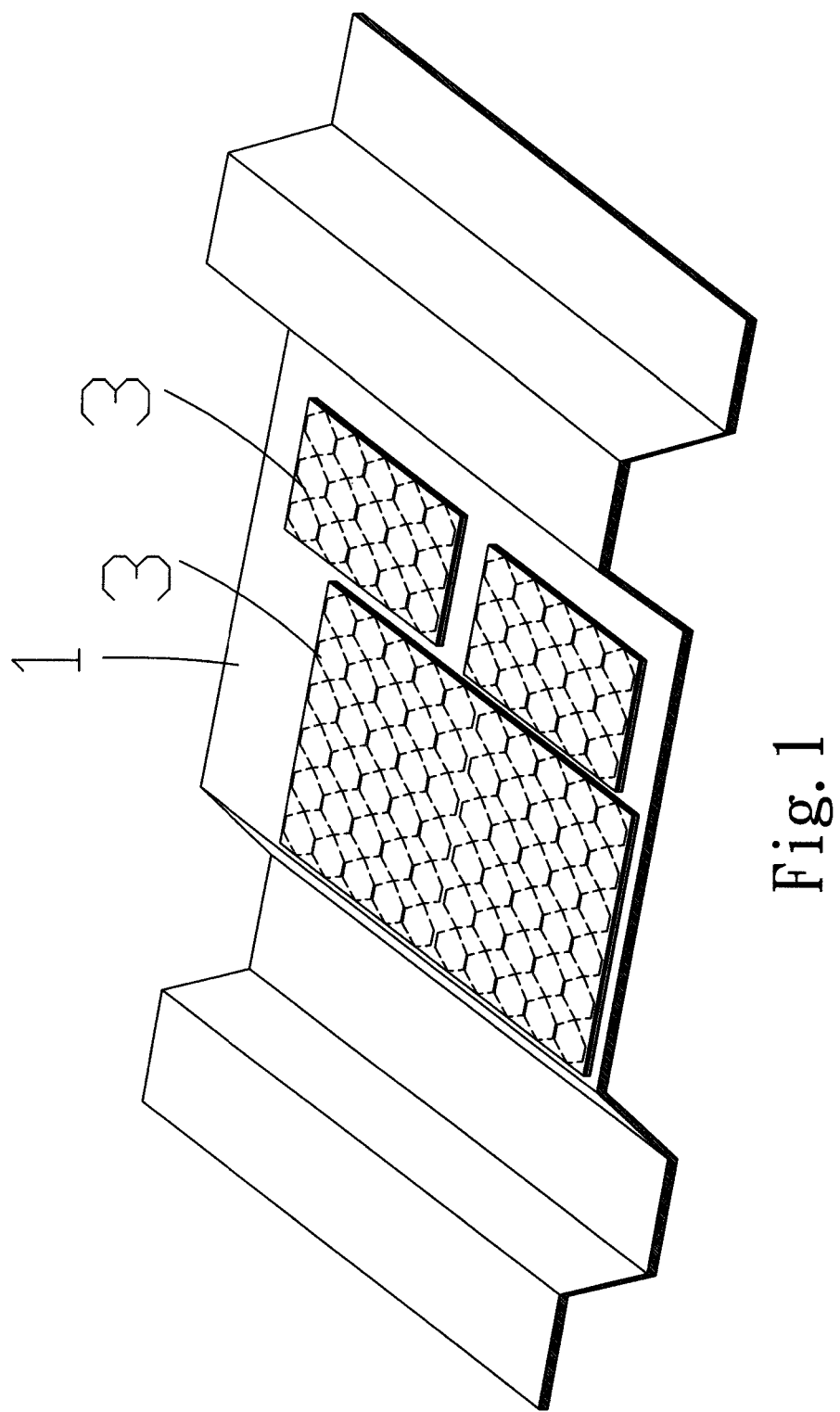
FIG. 1 is a perspective view of a basic embodiment of the present invention.
Figure 2:
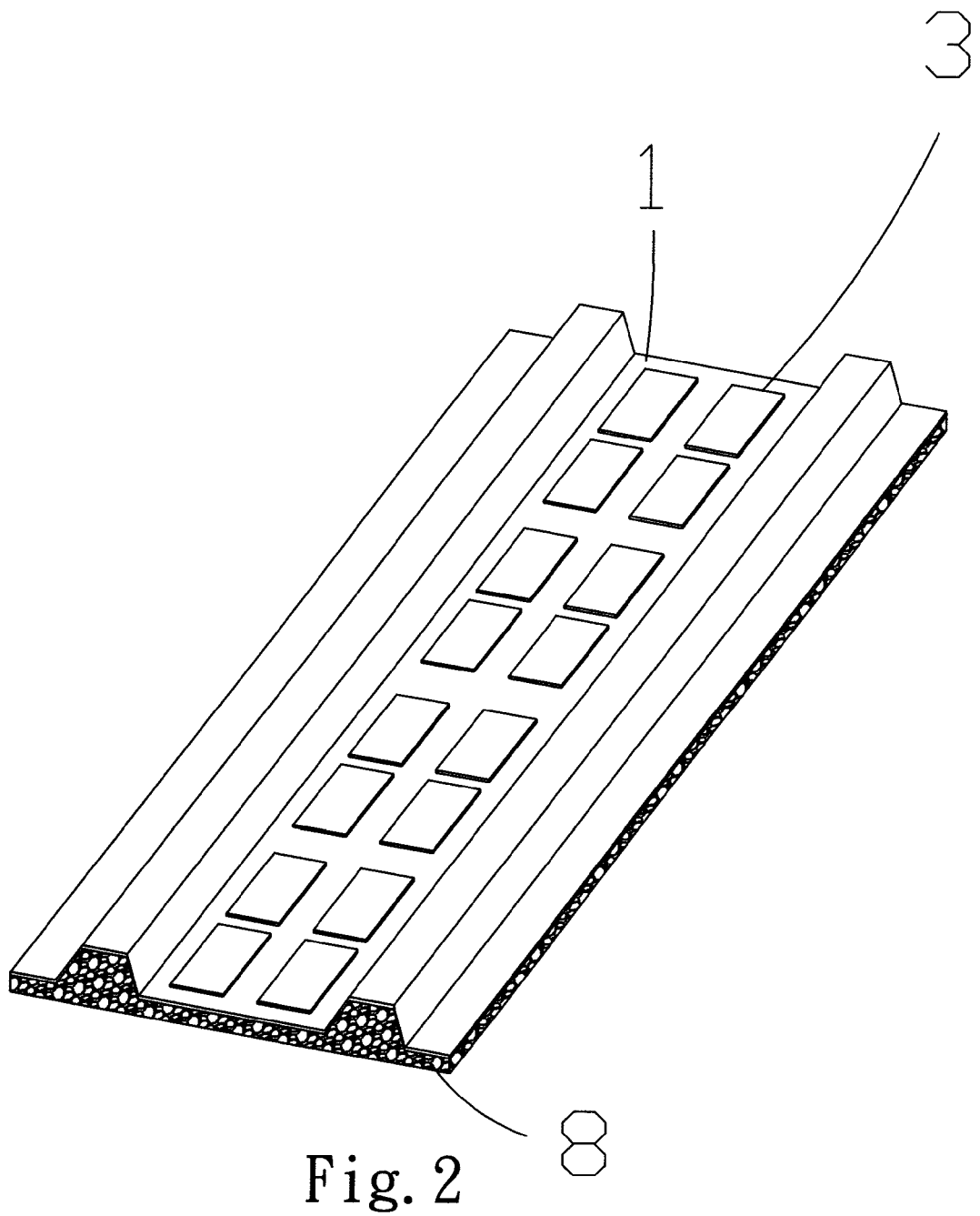
FIG. 2 is a perspective view of a large-scale embodiment of the present invention.
Figure 3:
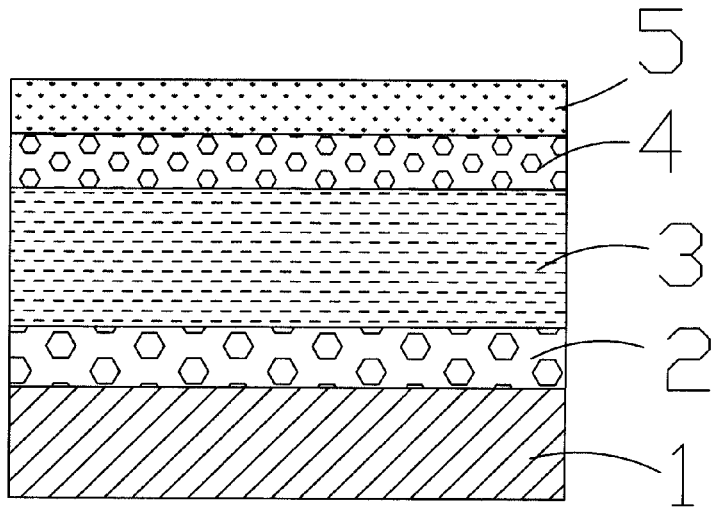
FIG. 3 is a cross-sectional view of a basic assembly of the present invention.
Figure 4:
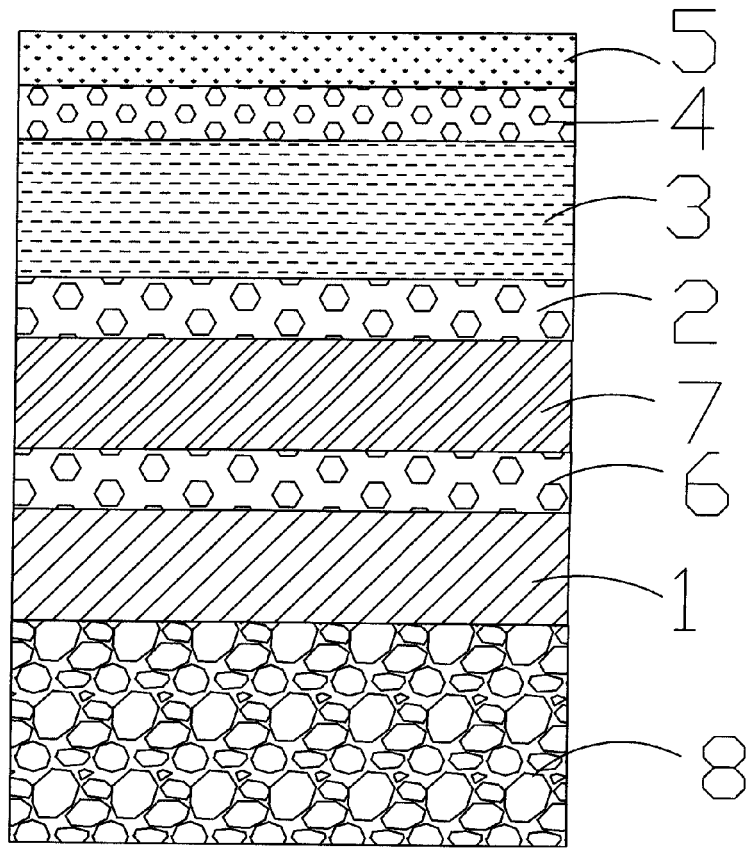
FIG. 4 is a cross-sectional view of an enhanced assembly of the present invention.

Referring to FIG. 1 through FIG. 4, the present invention provides a method for manufacturing a photovoltaic module formed on a corrugated-sheet building material. The method comprises the steps of: (step 1) shaping a board to function as a base board 1 in a manner that the board thus shaped takes on a corrugated-sheet shape and therefore not only has thereon alternating grooves and ridges but also a processing surface defined between a said groove and an adjacent said ridge; (step 2) forming a photovoltaic module on the processing surface of the base board 1 by stacking, including putting a bottom adhesive film layer 2 on the processing surface of the base board 1, putting a photovoltaic layer 3 on the bottom adhesive film layer 2, putting a top adhesive film layer 4 on the photovoltaic layer 3, and finally putting a condensing film layer 5 on the top adhesive film layer 4; (step 3) rolling the photovoltaic module and the base board 1 against each other at 130~180° C. to effectuate engagement therebetween; and (step 4) performing lamination on the photovoltaic module and the base board within a hermetically sealed space at 140~170° C. and 2~10 kg/cm2 for 5~10 minutes. The base board 1 is made of metal, such as steel, iron, aluminum, and/or copper, and/or is made of plastic, glass, and/or ceramic, and/or comes in form of a sugarcane board, a fiberboard, a paperboard, and/or a wooden board. Furthermore, it is feasible that a back plate layer 7 is disposed beneath the bottom adhesive film layer 2 of the photovoltaic module. The back plate layer 7 is connected to the base board 1 through another adhesive film layer 6. The adhesive film layers comprise EVA film or PVB film. The back plate layer 7 is made of insulating engineering plastic. A thermal insulation layer 8 made of PU foam or gypsum is disposed beneath the base board 1. The photovoltaic layer 3 is silicon based or thin-film. Referring to FIG. 1 and FIG. 2, it is feasible that construction states characterized by various scales and different combinations can exist on the corrugated-sheet-shaped base board, indicating that the manufacturing method of the present invention suits unlimited length and wide, attains lightweight, thin, and extensive application in accordance with different forms of corrugated sheet, and makes good use of the space necessary for photovoltaic conversion. The aforesaid characteristics of the present invention are not achievable by the prior art, and thus the building material becomes indispensable to a solution of energy supply.

In conclusion, the present invention applies the concept of continuous manufacturing to the accomplishment of a product, especially baking varnished corrugated sheet, which is widely applied to the structure of the tops of buildings. Basically, the corrugated sheet is lightweight, thin, and suitable for use with the products manufactured according to the present invention, not to mention that the corrugated sheet is available for immediate use without prior design, such that every family can gain access to solar power supply to thereby contribute to environmental protection and cut household power consumption. Accordingly, the manufacturing method of the present invention features ease of use and differs from conventional manufacturing methods of the prior art.

The present invention is disclosed above by a preferred embodiment. However, persons skilled in the art should understand that the preferred embodiment is illustrative of the present invention only, but should not be interpreted as restrictive of the scope of the present invention. Hence, all equivalent changes made to the aforesaid embodiment without departing from the spirit embodied in the present invention should fall within the scope of the present invention.

What is claimed is:

1. A method for manufacturing a photovoltaic module formed on a corrugated-sheet building material, the method comprising the steps of:

(step 1) shaping a board to function as a base board in a manner that the board thus shaped takes on a corrugated-sheet shape and therefore not only has thereon alternating grooves and ridges but also a processing surface defined between a said groove and an adjacent said ridge;

(step 2) forming a photovoltaic module on the processing surface of the base board by stacking, including putting a bottom adhesive film layer on the processing surface of the base board, putting a photovoltaic layer on the bottom adhesive film layer, putting a top adhesive film layer on the photovoltaic layer, and finally putting a condensing film layer on the top adhesive film layer;

(step 3) rolling the photovoltaic module and the base board against each other at 130~480° C. to effectuate engagement therebetween; and (step 4) performing lamination on the photovoltaic module and the base board within a hermetically sealed space at 140~170° C. and 2~10 kg/cm$^2$ for 5~10 minutes.

2. The method of claim 1, wherein the base board is made of metal, such as steel, iron, aluminum, and/or copper, and/or is made of plastic, glass, and/or ceramic, and/or comes in form of a sugarcane board, a fiberboard, a paperboard, and/or a wooden board.

3. The method of claim 1, wherein a back plate layer is disposed beneath the bottom adhesive film layer of the photovoltaic module, and the back plate layer is connected to the base board through another adhesive film layer.

4. The method of claim 3, wherein the back plate layer is made of insulating engineering plastic.

5. The method of claim 1, wherein the adhesive film layers comprise EVA film or PVB film.

6. The method of claim 1, wherein a thermal insulation layer made of PU foam or gypsum is disposed beneath the base board.

7. The method of claim 1, wherein the photovoltaic layer is silicon based or thin-film.

8. The method of claim 1, wherein the condensing film layer is made of plastic and rolled to form a geometrical structure conducive to enhancement of light penetration and light condensation.

* * * * *